United States Patent [19]

Oue et al.

[11] Patent Number: 5,323,136

[45] Date of Patent: Jun. 21, 1994

[54] ELECTROMAGNETIC APPARATUS

[75] Inventors: Tatsuya Oue; Takahiro Tanoue, both of Akou, Japan

[73] Assignee: Mitsubishi Denki Kabushiki Kaisha, Tokyo, Japan

[21] Appl. No.: 872,119

[22] Filed: Apr. 22, 1992

[30] Foreign Application Priority Data

Apr. 30, 1991 [JP] Japan .................. 3-098416

[51] Int. Cl.$^5$ .............................. G01V 3/00
[52] U.S. Cl. ................... 335/301; 324/320; 324/318
[58] Field of Search ............ 335/296, 297, 298, 301, 335/304; 324/318, 319, 320

[56] References Cited

U.S. PATENT DOCUMENTS

| | | |
|---|---|---|
| 2,128,005 | 8/1938 | Lombard . |
| 4,698,611 | 10/1987 | Vermilyea .................. 335/298 |
| 4,743,853 | 5/1988 | Frese . |
| 4,803,433 | 2/1989 | McBride . |
| 4,990,877 | 2/1991 | Benesch . |
| 5,001,448 | 3/1991 | Srivastava et al. ............ 335/301 |

FOREIGN PATENT DOCUMENTS

| | | |
|---|---|---|
| 272411 | 6/1988 | European Pat. Off. . |
| 303880 | 2/1989 | European Pat. Off. . |
| 4021345 | 1/1991 | Fed. Rep. of Germany . |
| 08126 | 10/1988 | PCT Int'l Appl. . |

OTHER PUBLICATIONS

U.S. Journal: "Special Purpose Fasteners" in "Machine Design", Nov. 1989, vol. 23, pp. 530-541.
Laughner, Vallory H., et al., "Handbook of Fastening and Joining of Metal Parts", 1956, p. 549.

*Primary Examiner*—Leo P. Picard
*Assistant Examiner*—Raymond Barrera
*Attorney, Agent, or Firm*—Sughrue, Mion, Zinn, Macpeak and Seas

[57] ABSTRACT

An electromagnetic apparatus has a housing with a cavity in which a uniform magnetic field is created by a magnetic coil disposed in the housing. The electromagnetic apparatus also has one or more containers for containing magnetic substances for adjusting the intensity distribution of the magnetic field in the cavity so as to obtain a uniform intensity, and clamps attached to the housing for detachably mounting the containers. During adjustment of the magnetic field in the cavity, a container is removed from the clamps, magnetic substances are added or removed, then the container is mounted in the clamps again.

15 Claims, 3 Drawing Sheets

ELECTROMAGNETIC APPARATUS

BACKGROUND OF THE INVENTION

The present invention relates to an electromagnetic apparatus used for example in magnetic resonance imaging systems, more particularly to the structure for attaching magnetic substances referred to as passive shims to correct magnetic field inhomogeneity.

The prior art electromagnetic apparatus shown in FIG. 1 is known well. An exploded and enlarged oblique view of the part A of FIG. 1 is illustrated in FIG. 2. The prior art electromagnetic apparatus comprises a housing 1 containing coils for generating the magnetic field. The housing 1 has a cavity wherein a uniform magnetic field is to be created in a space 2. Non-uniform components of the field in this space 2 are corrected by passive shims 3 such as soft iron bars. The passive shims 3 are housed in non-magnetic tubes 4 which are attached to the inner surface of the housing 1.

To install the non-magnetic tubes 4 in the housing 1, a support unit 5 is attached to the housing 1. The support unit 5 has holes 5a into which the non-magnetic tubes 4 fit, and projecting seats 5b for attaching the support unit 5 to the housing 1 by screws 6. An end plate 7 closes the end openings of the non-magnetic tubes 4 to prevent the passive shims 3 from escaping from the non-magnetic tubes 4. The end plate 7 is fastened to the support unit 5 by screws 8.

The magnetic field in the cavity is adjusted according to measurements of the magnetic field intensity in the space 2. If the measurements indicate that further adjustment of the magnetic field homogeneity is necessary, the end plate 7 is removed from the support unit 5 and passive shims 3 are added or removed. After this, the end plate 7 is reattached to the support unit 5, and the distribution of the magnetic field is measured again. If necessary, the above procedure is repeated until satisfactory field homogeneity is obtained.

The adjustment is first performed using soft iron wire about 3 to 5 mm in diameter, then gradually finer soft iron wire is used. The finest soft iron wire has a diameter of 1 mm or less.

A problem with the prior art electromagnetic apparatus is that the passive shims must be inserted into small holes in the non-magnetic tubes 4 against the magnetic force of a the strong magnetic field, of 15,000 gauss for example. Particularly in the fine adjustment of the field homogeneity, where thin wires must be inserted in or removed from the non-magnetic tubes 4, the passive shims bend under the influence of the magnetic field, making inserting them into the non-magnetic tubes difficult.

In order to avoid the problems caused by this magnetic force, the magnetic field could be reduced before the adjustment and raised again afterward, but in this case the electromagnets must be energized and de-energized, therefore the time required to adjust the magnetic field increases considerably. Also, in the case of superconducting magnets driven in persistent-current mode, opening and closing the persistent current switch to energize or de-energize the superconducting magnet uses up expensive liquid helium.

SUMMARY OF THE INVENTION

An object of the present invention is to provide an electromagnetic apparatus in which magnetic substances can be inserted and removed easily for adjustment of the homogeneity of the magnetic field in a magnetic field space.

An electromagnetic apparatus according to the present invention comprises a housing having a cavity in which a uniform magnetic field is created and a coil disposed in the housing for generating the magnetic field. The electromagnetic apparatus also comprises a container for containing magnetic substances for adjusting the intensity distribution of the magnetic field in the cavity so as to make the magnetic field in the cavity uniform, and clamps attached to the housing for detachably mounting the container. During adjustment of the magnetic field homogeneity, the container is removed from the clamps, magnetic substances are added to or removed from the container, then the container is mounted again in the clamps.

DETAILED DESCRIPTION OF THE INVENTION

Figure 1:
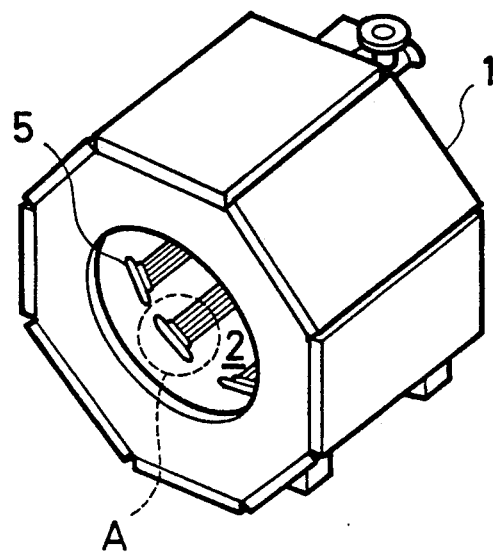
FIG. 1 is a perspective view illustrating a prior art electromagnetic apparatus.
Figure 2:
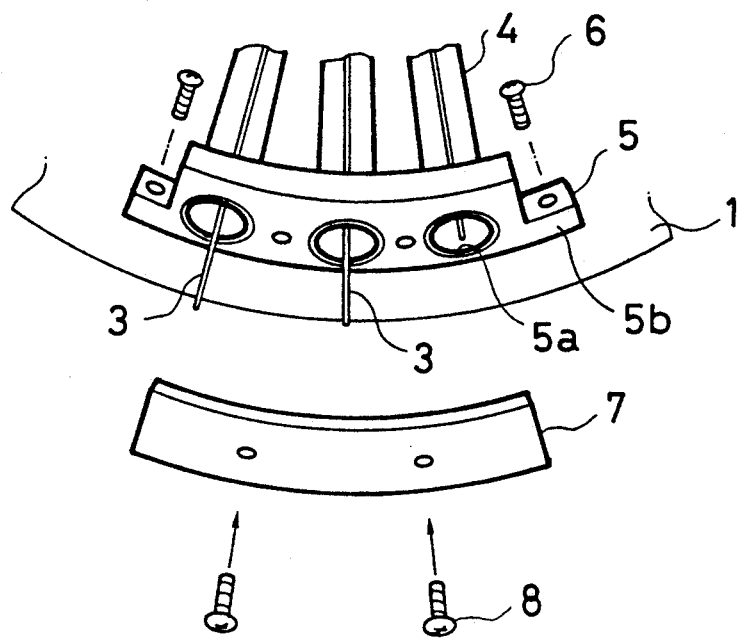
FIG. 2 is an exploded perspective view of the part A in FIG. 1.
Figure 3:
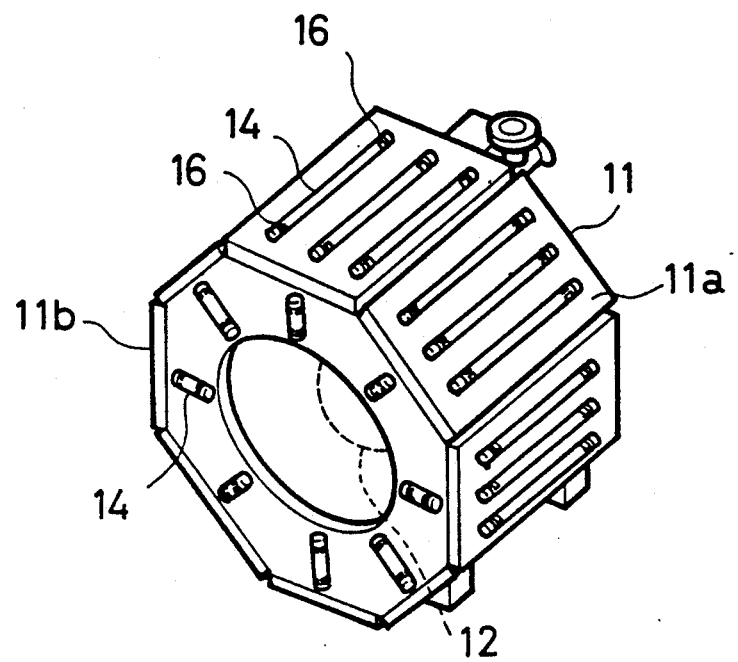
FIG. 3 is a perspective view illustrating the electromagnetic apparatus of a preferred embodiment of this invention.

A preferred embodiment of the present invention will now be described with reference to FIGS. 3 to 5.

As shown in these drawings, the electromagnetic apparatus of the embodiment comprises a housing 11 which contains a cylindrical magnetic coil 19 disposed in substantially coaxial fashion for generating a magnetic field, and a cryostat 20 surrounding the coil 19. The housing 11 has a hollow octagonal pillar configuration with a cylindrical interior cavity. The cavity forms a magnetic field space 12 in which a uniform magnetic field is to be created.

The electromagnetic apparatus furthermore comprises clamps 16 attached to the housing 11 for mounting non-magnetic tubes 14. Each non-magnetic tube 14 may contain one or more magnetic substances, referred to as passive shims 13, for adjusting the intensity distribution of the magnetic field in the magnetic field space 12 to eliminate non-uniformities. The passive shims 13 have the form of, for example, soft iron bars. The non-magnetic tubes 14 are made of, for example, polycarbonate. Both open ends of each non-magnetic tube 14 are blocked by caps 15.

Pairs of clamps 16 are provided on the circumferential outer surfaces 11a and end plates 11b of the housing 11. The separation between each pair of clamps 16 corresponds to the length of the non-magnetic tube 14 to be held. Each of the clamps 16 comprises a pair of leaf springs; the non-magnetic tube 14 is held between the pair of leaf springs by spring force. The upper parts of the leaf springs bend outwardly so as to form a guide part 16a for inserting the non-magnetic tube 14 by pressing. Each of the leaf springs has a hole 16b into which a split pin 18 is inserted in order to lock the non-magnetic tube 14 so that it cannot escape from the clamps 16. To prevent the non-magnetic tubes 14 from sliding in the longitudinal direction, stoppers 17 are provided at both ends of the non-magnetic tube 14.

In the electromagnetic apparatus described above, passive shims 13 are inserted into a non-magnetic tube 14 at a location far enough from the housing 11 that the magnetic field strength is less than 100 gauss. Then both open ends of the non-magnetic tube 14 are closed by caps 15 to prevent the passive shims 13 from escaping under stress of magnetic force.

The non-magnetic tube 14 is then pressed through the guide parts 16a into the clamps 16 and held. The stopper 17 prevent the non-magnetic tube 14 from sliding in the longitudinal direction. Other non-magnetic tubes 14 are placed and held in their clamps 16 by the same procedure.

If results of measurements of the magnetic field in the space 12 indicate that further adjustment of the magnetic field homogeneity is necessary, the non-magnetic tube 14 requiring a change of passive shim is removed from its clamps 16, and passive shims are added or removed as necessary, this operation again being performed at a location distance from the housing 11. After the necessary modification of passive shim mass has been made, the non-magnetic tube 14 is replaced in its clamps 16, and the homogeneity of the magnetic field in the space 12 is measured again. The above procedure is repeated until the desired field homogeneity is obtained.

After all adjustments have been made, split pins 18 are inserted into the holes 16b of the clamps 16, thus locking the non-magnetic tubes 14 so that they cannot escape from the clamps 16 under influence of magnetic force, even if the spring force of the clamps 16 weakens. This completes the adjustment procedure.

The detachability of the non-magnetic tubes 14 from the clamps 16 in the above described embodiment enables the passive shims to be replaced in a location with low magnetic field intensity, so the passive shims 13 can be inserted easily, without bending, into the non-magnetic tubes 14. Provision of guide parts 16a on the clamps 16 furthermore enables the non-magnetic tubes 14 to be inserted into the clamps 16 easily, simply by pressing. Moreover, since the clamps 16 are held by split pins 18, even if the spring force of the clamps 16 becomes weakened, the non-magnetic tubes 14 are prevented from escaping from the clamps 16.

By detachable mounting of non-magnetic tubes that contain passive shims, this invention makes it possible to provide an electromagnetic device that permits passive shims to be replaced easily during magnetic field homogeneity adjustment.

Figure 4:
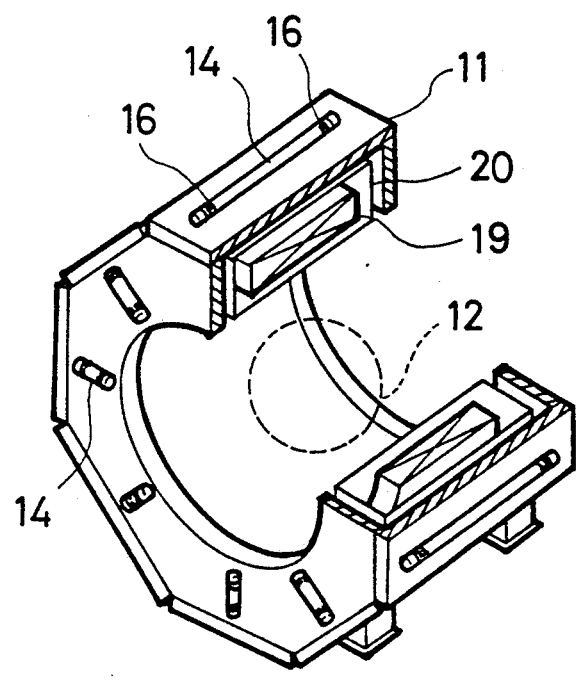
FIG. 4 is a partially cutaway perspective view of the electromagnetic apparatus of FIG. 3.
Figure 5:
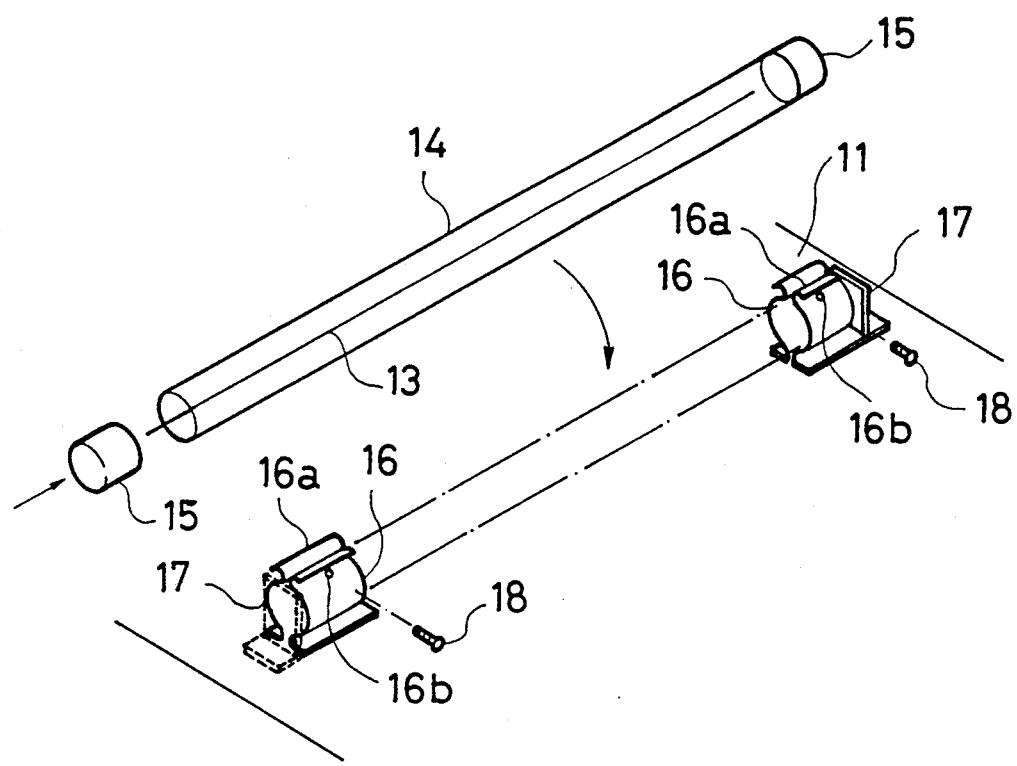
FIG. 5 shows the novel part of the electromagnetic apparatus of FIG. 3.

The passive shims 13 in the above embodiment were described as being disposed around the outer circumferential surface 11a and end plates 11b of the housing 11, but of course the invention can also be applied when the shims are disposed inside the cavity of the housing 11 as shown at 21 in FIG. 4.

Also, the above embodiment employs circular cylindrical non-magnetic tubes 14, but tubes with other configurations such as oval-shaped cylindrical tubes would yield similar effects.

What is claimed is:

1. An electromagnetic apparatus comprising:
   a housing having a cavity;
   a magnetic coil disposed in said housing for generating a magnetic field having an intensity distribution in the cavity;
   a hollow, linear, elongate container for containing elongate magnetic members for adjusting the intensity distribution of said magnetic field so as to make the intensity distribution of the magnetic field uniform in the cavity; and
   clamps attached to said housing for detachably mounting said container.

2. The apparatus of claim 1, wherein said clamps are attached to an outer surface of said housing.

3. The apparatus of claim 1, wherein said housing has an octagonal pillar configuration.

4. The apparatus of claim 1, wherein said container is made of non-magnetic material.

5. The apparatus of claim 4, wherein said container is made of polycarbonate.

6. The apparatus of claim 1, wherein said container is a cylindrical tube.

7. The apparatus of claim 6, further comprising caps for closing both open ends of said cylindrical tube.

8. The apparatus of claim 6, wherein a pair of said clamps hold said cylindrical tube.

9. The apparatus of claim 8, wherein said clamps are separated by a distance corresponding in length to said cylindrical tube.

10. The apparatus of claim 8, wherein each of said clamps comprises a pair of leaf springs, said cylindrical tube being held between said pair of leaf springs.

11. The apparatus of claim 9, wherein each upper part of said leaf springs bend outwardly so as to form a guide part for inserting said cylindrical tube by pressing.

12. The apparatus of claim 10, wherein each of said leaf spring has a hole into which a split pin is inserted for locking said cylindrical tube in place.

13. The apparatus of claim 7, further comprising stoppers for preventing said cylindrical tube from moving in a longitudinal direction.

14. The apparatus of claim 1, wherein said magnetic members are made of soft iron bars.

15. The apparatus of claim 14, wherein the thickness and number of said soft iron bars are selected according to results of measurements of the intensity distribution of the magnetic field in the cavity.

* * * * *